United States Patent [19]

Keeler et al.

[11] Patent Number: 4,691,419
[45] Date of Patent: Sep. 8, 1987

[54] ROBOT END EFFECTOR FOR PROCESSING COMPONENT LEADS

[75] Inventors: Brian G. Keeler, Plainsboro; George J. Whitley, Philadelphia, both of N.J.

[73] Assignee: RCA Corporation, Princeton, N.J.

[21] Appl. No.: 797,132

[22] Filed: Nov. 12, 1985

[51] Int. Cl.$^4$ ............................................. B23P 19/00
[52] U.S. Cl. ...................................... 29/39; 29/566.3; 29/739; 29/741; 140/105; 901/30; 901/41
[58] Field of Search .................. 140/105, 106; 901/30, 901/41, 50; 29/35.5, 39, 40, 42, 566.3, 739–741, 838, 564.8

[56] References Cited

U.S. PATENT DOCUMENTS

| | | | |
|---|---|---|---|
| 3,259,958 | 7/1966 | Lemelson | 408/16 X |
| 3,272,347 | 4/1966 | Lemelson | 414/728 |
| 4,377,026 | 3/1983 | Whitley | 29/564.1 |
| 4,462,435 | 7/1984 | Whitley | 140/105 |
| 4,463,310 | 7/1984 | Whitley | 324/73 |
| 4,464,829 | 8/1984 | Whitley et al. | 29/741 |
| 4,513,493 | 4/1985 | Whitley et al. | 29/566.3 |
| 4,520,549 | 6/1985 | Whitley et al. | 29/566.3 |
| 4,587,703 | 5/1986 | Azizl et al. | 901/30 X |

OTHER PUBLICATIONS

Photograph of Toshiba Component Insertion Robot.

Primary Examiner—Gil Weidenfeld
Assistant Examiner—Steven C. Bishop
Attorney, Agent, or Firm—Joseph S. Tripoli; William Squire

[57] ABSTRACT

A turret is rotatably secured to a housing adapted to be secured to a robot wrist having a reference orientation and axis. The turret has a plurality of interchangeable lead processing devices which are selectively aligned to the reference orientation and axis. When so aligned a lead processing device is engaged with a selected component and operated to cut and bend the lead of that component. A second component's lead may be processed by the same or a different lead processing device secured to the turret. The latter device is aligned to the reference orientation and axis prior to processing the second component's lead. The robot is programmed to align the reference axis and the corresponding processing device to the selected component whose lead is to be processed.

15 Claims, 4 Drawing Figures

ROBOT END EFFECTOR FOR PROCESSING COMPONENT LEADS

This invention relates to a robotically operated apparatus for processing the leads of a component on a substrate, for example, cutting and then bending over the cut leads of a component on a printed circuit board (PCB).

Apparatus exists for processing leads of a component on a PCB. The term "processing" includes cutting or otherwise severing the leads and/or bending over the component leads. The leads are bent to prevent the component from separating from the PCB. In printed circuit board assemblies, components need to be secured to the PCB until such time as the component is secured to the substrate by other means such as soldering in a subsequent manufacturing step. The term "lead" includes leads of electrical components, mechanical tabs and other appendages employed to secure a component to a substrate. The term "component" means any element including electrical or mechanical structures which are required to be secured to a substrate by processing a portion of that structure.

The term "robot" as employed herein, means a computer controlled apparatus having a reference x, y, z and $\theta$ coordinates, where $\theta$ is the angular position about the z axis from a reference orientation. Robots include articulated links which can locate a "wrist" at the end of the links anywhere in a three dimension (x, y, and z) location from a reference position. The wrist is rotatable relative to its support to orient the wrist angle $\theta$, usually about a vertical axis, relative to a reference orientation. Robots also include numerically controlled machines having a table which displaces in x, y, and z directions and rotates about the z axis an angle $\theta$ from a reference set of coordinates and orientation. The table includes structure for securing a workpiece processing tool thereto, the term "wrist" including such a structure. Such a tool is referred herein as an end effector. The wrist is controlled by a system controller programmed by the user. These systems are flexible in that the applicable computer programs are easily written and exchanged with the computer in accordance with a given implementation.

Examples of component lead processing apparatuses are illustrated in U.S. Pat. Nos. 4,377,026; 4,462,435; 4,464,829; 4,513,493; and 4,520,549. All of the above patents are assigned to the assignee of the present invention. By way of example, in U.S. Pat. No. 4,520,549 there is disclosed a system for concurrently processing multiple leads of one or more components in which the leads extend through a printed circuit board and project therefrom on the side opposite the components. The system comprises a support structure and a plurality of component lead processing assemblies lying in a plane. Means are secured to the support structure for aligning a printed circuit board relative to the lead processing assemblies. Each assembly comprises an anvil mounted to the support structure and a lead processing means rotatable relative to the anvil and cooperating with the anvil for processing the projecting leads. Link means are coupled to a plurality of the processing means and are movable relative to the support structure for concurrently rotating each of the processing means. The link means comprises a plate and connecting means corresponding to each processing assembly coupled to the plate and each corresponding lead processing means. Drive means are coupled to the plate for reciprocating the plate in directions to concurrently rotate all of the lead processing means a partial revolution in one rotational direction and then in the opposite rotational direction whereby the leads of each component are processed.

Other of the aforementioned patents disclose a number of different lead processing devices, for example, as specifically disclosed in U.S. Pat. Nos. 4,464,829; 4,520,549; 4,513,493; and 4,462,435. Many of the disclosed lead processing devices can be attached for operation by the apparatus of the 4,520,549 system. That system is successful in processing electrical component leads, tabs of transformer housings, and sheet metal elements which are required to be bent or trimmed as the case may be on one PCB layout. However, that system in one embodiment requires separate unique plates which mate with a given PCB layout.

Also of interest are copending U.S. patent applications Ser. No. 589,330, filed Mar. 14, 1984, now U.S. Pat. No. 4,561,116, entitled "Component Lead Processing apparatus"; by George J. Whitley; Ser. No. 558,367,now U.S. Pat. No. 4,557,043 filed Dec. 5, 1983, entitled "Component Lead Processing Apparatus," by Wojciech Starski; and Ser. No. 688,997, now U.S. Pat. No. 4,569,127, filed Jan. 4, 1985, entitled "Apparatus for Securing a Component to a Printed Circuit Board," by George J. Whitley, all of the above copending applications being assigned to the assignee of the present invention.

The present inventors realize that it is desirable to process the leads of components to be attached to a substrate such as a PCB with a minimum of tooling, for example, by a robot. A robotic system can process a plurality of differently configured PCBs, i.e., different component layouts with a minimum of costly tool changes. The present inventors recognize, for example, that a single end effector attached to a robot may secure a plurality of different kinds of interchangeable lead processing devices thereto. By using appropriate computer programs the robot may be quickly and easily programmed to process the leads in different layouts at low cost.

In a robotic system, a few differently configured lead processing devices, each corresponding to a different given component lead arrangement, can be moved about and located to a given set of coordinates and orientation from the robot's reference position. The angular component $\theta$ of the robot motion provides flexibility not otherwise possible. Thus, a robotic system tends to avoid the need for manufacturing and storing a large number of differently configured tools, each unique to a given PCB layout, or at best a large number of lead processing devices each having a given fixed orientation relative to a support. The latter requires duplication of identical devices to correspond to different $\theta$ orientations of the different components.

A robotically operated apparatus according to the present invention processes a component lead extending from a substrate at a reference location and orientation. The apparatus includes a lead processing device having a first element and a second element at least one of which movably cooperates with the other to process the lead and further comprises a support adapted to be attached to the robot. A member is secured to the support and includes a plurality of spaced means for releasably securing a like plurality of lead processing devices thereto. Each of the spaced means for securing are adapted to receive a separate lead processing device at a given location and orientation. The robot includes means for placing a selected one of the spaced means for securing at the reference location and orientation. An apparatus is coupled to the member for operating at least that selected lead processing element at the reference location and orientation. Each of a plurality of lead processing devices which are secured to the spaced means can be selectively placed in position at the reference location in the desired orientation for processing a corresponding component lead at that location regardless that lead's orientation. The robot locating system can then move any selected one of the spaced means and its corresponding device to a different lead reference location and orientation corresponding to a second component whose lead is to be processed. Thus, a substrate with a plurality of components with differently configured and oriented leads and a plurality of substrates having components in different orientations can be readily and automatically processed by a robot.

In the drawing

Figure 1:
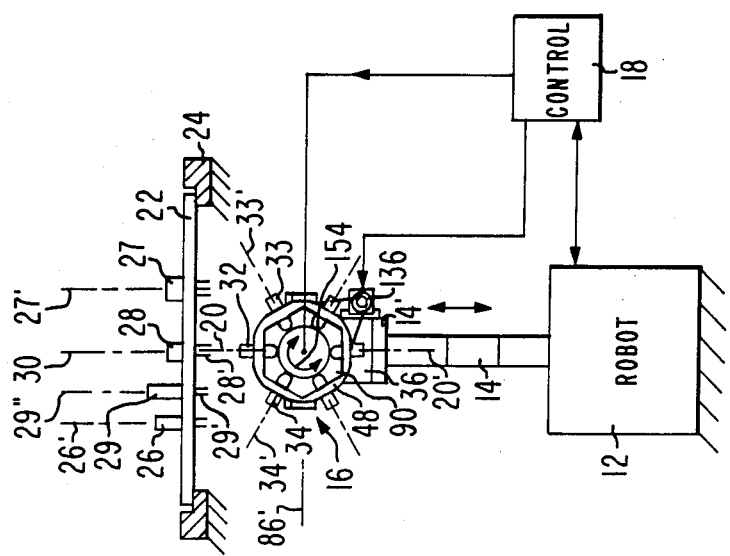
FIG. 1 is a front elevation view, partially schematic, of a robotic system for processing leads of a component in accordance with one embodiment of the present invention.

In FIG. 1, system 10 includes a robot 12 having an arm 14 and a wrist 14' to which is secured end effector 16 which includes a rotatable turret to be described below in accordance with one embodiment of the present invention. The robot 12 and end effector 16 are operated by control 18 which includes a commercially available programmable computer system for positioning the wrist 14' and end effector 16 at a robot reference position, for example, as defined by axes 20', 86, and 86'. There is also a θ reference position (FIG. 4) which is a given angular orientation of wrist 14'about axis 20'. This reference position and orientation is known a priori by control 18 and is the reference coordinates from which the control 18 can be programmed to position the wrist 14' to any relative set of coordinates and orientation about axis 20'.

A printed circuit board (PCB) 22 (or any other component carrying substrate) is carried by a conveyor system 24 (schematically shown) for aligning components 26, 27, 28, and 29 relative to a conveyor reference position. The conveyor system aligns the PCB in a given x, y, z, and θ reference position orientation relative to the reference coordinates of robot 12 represented by axes 86, 86', 20', and angle θ about axis 20'. Axes 86 and 86' define a plane parallel to the plane of board 22, axis z is perpendicular to that plane and generally is vertical. Printed circuit board 22 includes components 26-29 having leads projecting through the underside of the printed circuit board which are required to be trimmed and/or bent over. A plurality of identical components may be on the PCB, however, these components may have different lead orientations. Other elements (not shown) may include, for example, metal frames and other structures having tabs projecting through the printed circuit board substrate similar to the leads of components 26-29 which also may be at different relative orientations and which are to be processed by end effector 16. Examples of lead processing devices for processing component leads are illustrated in more detail in various ones of the patents and copending applications mentioned in the introductory portion above.

In FIG. 1, component 28 is aligned on a component axis 30. Axis 30 is aligned by the conveyor system 24 in a known way relative to robot x, y, z, and θ coordinates. Component 28 has a given x, y, z, and θ set of coordinates relative to the wrist 14' reference coordinates. The axis 30 is so located by conveyor 24 that end effector 16 axis 20' can be aligned coaxially with axis 30 and in the proper orientation angle θ, about axis 20' by control 18.

Secured to end effector 16 are a plurality of lead processing devices 32, 33, 34, and so forth up to a maximum of six devices in this embodiment. More or fewer can be used in other implementations. Each such device has its own operating axis and a given orientation on the end effector 16. For example, device 32 has an operating axis 20, device 33 has an operating axis 33', device 34 has an operating axis 34', and so forth, for all lead processing devices on end effector 16. Each device has a fixed orientation relative to its operating axis. The operating axis of any selected one device, e.g., axis 20 of device 32, can be positioned coincident with robot axis 20'. Thus, rotation of wrist 14' about its axis 20' also rotates and orients the device aligned therewith about its operating axis accordingly. This can accommodate any orientation of a given component to be processed relative to axis 20'.

Control 18 is programmed to align any of the operating axes of a selected lead processing device with robot axis 20' and then to align axis 20' with the corresponding component axis for processing the leads of that selected component. Each lead processing device may be used to process similar leads of a plurality of components. For example, lead processing device 32 may be adapted to process the leads of component 28 which may be a two leaded capacitor. Device 32 may also process the leads of component 26 which may be identical to component 28 but oriented about its axis 26' differently than component 28 about its axis 30. In that case, control 18 is programmed to align and orient the lead processing device's operating axis 20 relative to robot axis 20', and with axis 30 of component 28. Device 32 is then operated to process leads 28'. Control 18 is programmed to move the end effector 16 so that robot axis 20' is aligned with the next selected component, e.g., axis 26' of component 26, rotates wrist 14' accordingly about axis 20' and then move the lead processing device 32 into position for processing the leads of component 26.

Assume, by way of a second example, that component 29 is a transformer having a set of tabs 29' projecting beneath PCB 22 and assume that device 33 attached to end effector 16 is adapted for bending the tabs 29'. Control 18 moves the lead processing device 33 into position in one of directions 154 so that its operating axis 33' is aligned on axis 20'. Axis 20' is then moved into alignment with axis 29" of component 29. Axis 33' of device 33 is now aligned with axis 29". In the meantime, while the lead processing device 33 axis 33' is so aligned that lead processing device is rotated as necessary about axis 20' to orient it to the orientation of leads 29'. When so positioned, the device 33 is engaged with the component's leads and control 18 operates device 33. In this way, each lead processing device is placed in position and in the proper orientation for operating on the leads of a corresponding component on PCB 22 regardless of that component's orientation.

In the alternative to the system of FIG. 1, a numerically controlled machine (NCM) (not shown) can be used. In a NCM, the end effector 16 can be supported on and carried by an x, y, z, and $\theta$ table under control of a computer. The table is movable in any x, y horizontal direction, can be moved vertically in the z direction and can be rotated to any angle $\theta$ about the z axis under control of a computer program. In a further alternative, instead of the end effector 16 illustrated in FIG. 1, a system similar to the system disclosed in U.S. Pat. No. 4,520,549 can be attached as an end effector to the NCM x, y, z, $\theta$ table in place of a fixed support. In the latter instance, any one of a number of different configured lead processing devices are secured to the system and can be robotically moved into alignment with any selected component for processing that component's lead or leads.

Figure 2:
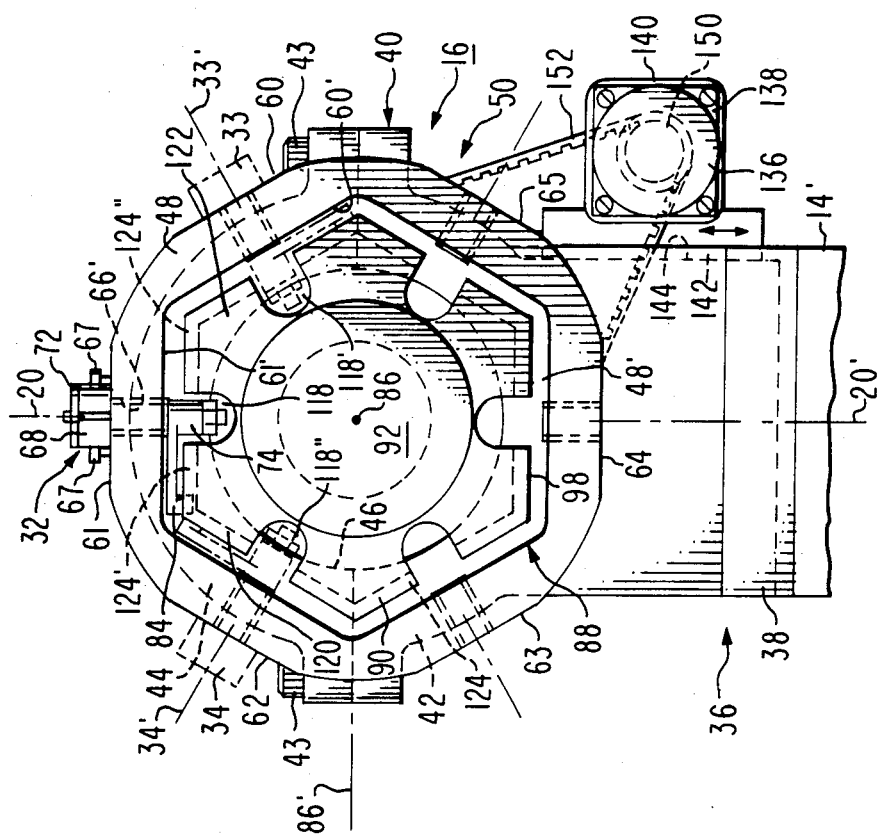
FIG. 2 is a front elevation view of an end effector used with the robot of FIG. 1 for carrying and operating lead processing devices.
Figure 3:
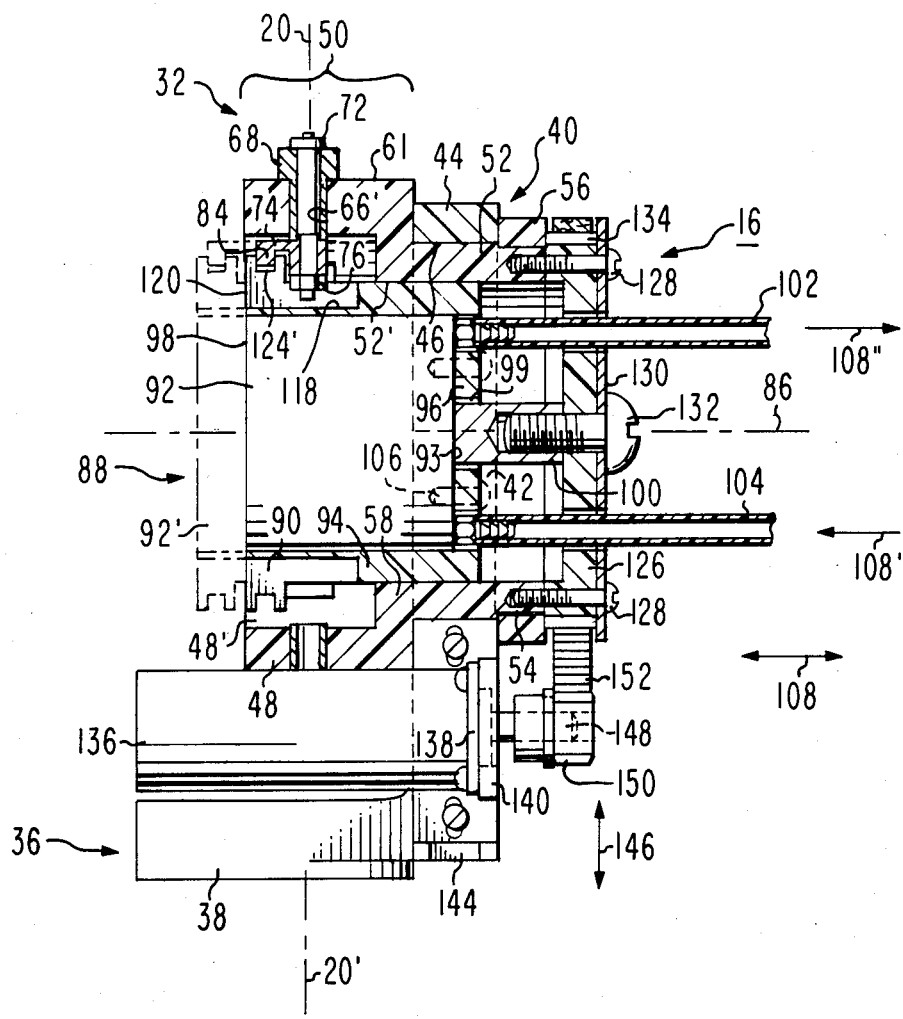
FIG. 3 is a side elevation view, partially in section, of the end effector of FIG. 2.
Figure 4:
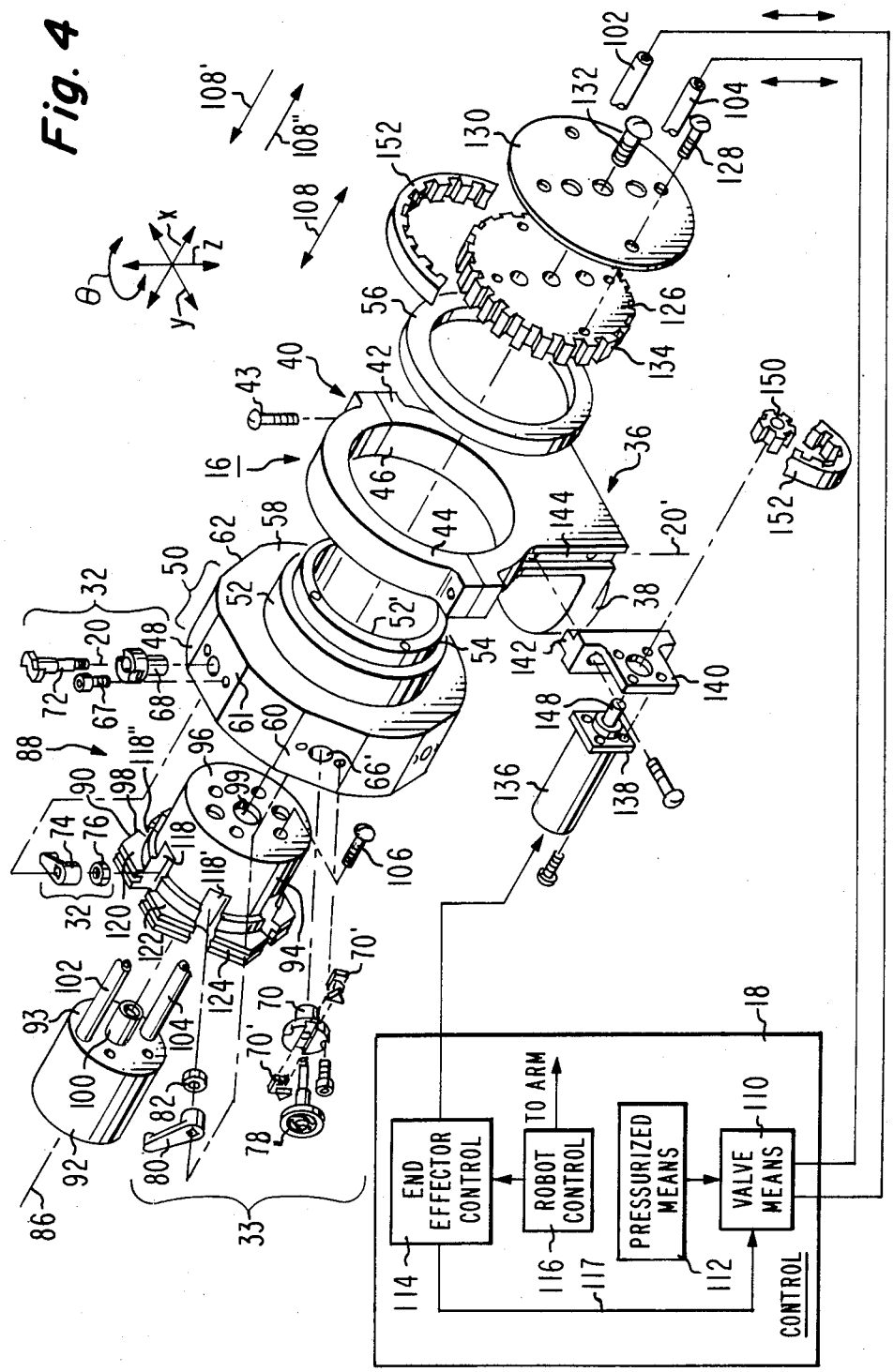
FIG. 4 is an isometric exploded view of the end effector of FIGS. 2 and 3 including a schematic diagram of one embodiment of a control system for operating that end effector.

In FIGS. 2, 3, and 4, end effector 16 is disclosed, by way of example, as a turret-like structure and includes an L-shaped housing 36 having a base 38 adapted to be secured to robot wrist 14' (FIG. 1). Base 38 of the housing 36 has a circular cylindrical shape which mates with wrist 14' and includes mounting apertures for receiving wrist 14' of a conventional commercially available robot. Ring 40 upstands from base 38. Ring 40 includes a lower half 42 upstanding from base 38 and an upper half 44 which is clamped to the lower half 42 by screws 43. In the alternative, ring 40 may be a single integral unit rather than two split elements as shown. The ring 40 internal surface 46 is a bearing defining a horizontal bearing axis 86. Rotatably secured within bearing surface 46 is a lead processing device support turret 48. In the alternative the turret may be rotatable about a non-horizontal axis.

Turret 48, FIGS. 3 and 4, is a hollow cylindrical member comprising a lead processing device support section 50 and a bearing 52 section slidably received within ring 40 rotatably abutting bearing surface 46. Turret 48 has shoulder 54 next to bearing 52 which receives locking ring 56. Ring 56 is glued or otherwise secured to shoulder 54 for rotatably locking the turret 48 to ring 40. Side wall 58 of section 50 is in sliding engagement with a side wall of ring 44. A side wall of locking ring 56 is also in sliding engagement with ring 40.

Section 50, FIGS. 2 and 4, comprises a plurality of annularly spaced flat regions 60, 61, 62, 63, 64, and 65. These flat regions are parallel to axis 86 and are formed in an otherwise circular cylindrical ring. In the alternative, the flat sections may comprise spaced pedestals (not shown) projecting upwardly from a supporting ring structure.

In FIG. 2, turret 48 has a hollow core 48' comprising a set of flat regions each parallel to a corresponding respective exterior flat region 60-65 forming a hexagonal internal space. External flat region 61 has a corresponding internal core flat region 61', flat region 60 has corresponding core flat region 60', and so forth.

Region 61, FIG. 4, includes an aperture array 66 comprising a central circular cylindrical aperture 66' and a pair of threaded apertures 67. The long axis 20 of aperture 66' defines the lead processing device operating axis. Axis 20, as illustrated by way of example, is coincident with robot axis 20'. Aperture 66' is in communication with the core 48'. A similar aperture array is formed in each flat region. Each array has a central aperture 66' defining a corresponding operating axis 33', 34' and so forth, all of which axes lie in a plane normal to axis 86. These operating axes serve as lead processing device reference locations and are spaced around the periphery of section 50.

Aperture 66' of array 66 receives lead processing device 32 stationary head 68. In FIG. 2, only one lead processing device 32 is illustrated for simplicity of illustration. Devices 33 and 34 are shown in phantom. Device 32 may be similar to the device illustrated in the aforementioned U.S. Pat. No. 4,520,549 or other of the patents and copending applications mentioned in the introductory portion, for processing leads or for bending tabs and the like, the device 32 being illustrative. The device 32 head 68 is secured in aperture 66' in a given orientation relative to axis 20 on region 61 by two screws 67, FIG. 2. Device 32 includes a movable lead processing element 72 which cuts and bends component leads having a given orientation relative to axis 20 in cooperation with assembly 68. Element 72 is secured in head 68 for rotation about axis 20. A lever 74 is secured to the extended end of element 72 projecting through head 68 and aperture 66' into core 48'. Lever 74 rotates the element 72 relative to assembly 68. Lever 74 is secured to a threaded stem of element 72 by nut 76 in core 48'.

A second different device 33, FIG. 4, is illustrated attached to flat region 60 similarly as device 32 is attached to region 61. Assuming device 32 cuts and bends leads, device 33 may be adapted to only bend leads. Such a device is disclosed in more detail in U.S. Pat. No. 4,462,435. Device 33, however, is similar to device 32 in that it has a stationary head 70 secured to external flat region 60, a rotatable element 78 and a drive lever 80 secured to the rotatable element by a nut 82 in core 48' aligned with region 60. Element 70, when rotated, radially displaces lead bending cams 70'. All of the lead processing devices attached to the turret 48 are similar in construction in that they have a stationary element secured external to turret 48 at one of the flat regions, a rotatable element secured in an aperture corresponding to aperture 66' and that rotates relative to the stationary element, and a drive lever attached to the stem of the rotating element projecting beyond the stationary element.

The drive lever is secured to the movable element by a nut in core 48'. Each lead processing device drive lever, for example, lever 74, FIG. 3, has a depending drive pin 84. It should be understood that not every flat region 60-65 need have a lead processing device attached thereto. Further, a lead processing device need not be attached to adjacent ones of the flat regions but may be secured at any desired one or more of the regions in any order. Further, each device is used to process component leads of a given configuration and to perform a given operation. For example, one device may process transistor leads, a second device may bend integrated circuit leads, and a third device may twist metal tabs of a transformer housing.

The turret 48 rotates within ring 44 about axis 86. The operating axes, i.e., the axes 33', 34' and so forth of apertures 66', extend normal to and radially away from axis 86 so that all of such lead processing axes intersect substantially at axis 86, FIG. 2. As the turret 48 is rotated about axis 86, any selected one of the operating axes, e.g., axis 20 of device 32, can be located coincident with or in a reference position relative to the robot reference axis 20' and thus with the reference coordinates defined by the intersection of axes 86, 86', and 20'. The robot wrist 14' is spaced relative to PCB 22 by the robot 12, FIG. 1, so that the intersection of axes 86, 86', and 20' is positioned aligned on the axis of a selected one of the components to be processed, e.g., axis 30 component 28. The wrist 14' is rotated about axis 20' by robot control 18 so that the orientation of device 32 matches the known orientation of that component relative to its axis 30. This matches the device orientation to the orientation of the component leads 28'.

Turret 48 bearing 52, FIG. 3, has an internal bearing surface 52', forming a circular cylindrical portion of the turret core 48'. Bearing 52 has an external bearing surface that is concentric with and engages the internal bearing surface 46 of ring 40. Lever actuating assembly 88 is axially slidably secured to bearing 52 surface 52' for movement in directions 108. In FIGS. 3 and 4, actuating assembly 88 comprises a lever drive member 90 and a pressurized fluid operated, e.g., pneumatic, cylinder 92. The term "fluid" as used herein means gases and liquids. Member 90 comprises a circular cylindrical shell 94 terminating at one end in a radially inwardly directed flange 96. The end wall 93 of cylinder 92 is attached to flange 96, FIG. 3, by screws 106. Flange 96 has a central aperture 99 through which passes shaft 100 of cylinder 92. A pair of pressurized fluid, e.g., air, supply lines 102 and 104 attached to cylinder 92 pass through corresponding apertures in flange 96. Cylinder 92 has a circular cylindrical body which is closely received in the circular cylindrical core of shell 94. Shell 94 mates with bearing 52 so as to slidably engage that bearing for relative movement in axial directions 108 parallel to axis 86.

The lines 102 and 104 are connected to valve means 110. The valve means 110 couple a source of pressurized fluid 112, e.g., air, to a selected one of lines 102 or 104 as determined by end effector control 114 in response to a control signal from robot control 116. Control 116 is a computer programmable system which can be selectively programmed to cause the robot to operate in a desired manner. The robot control 116 has a plurality of outputs, one of which is coupled to the end effector control 114. The robot control 116 also operates the robot arm in a known way. The end effector control 114 applies a signal via line 117 to the valve means 110 for selectively causing the valve means to operate and apply pressure to one of lines 102 or 104 for the purpose of operating cylinder 92 in a manner to be explained. Pressure on line 102, by way of example, causes the shaft 100 to extend, whereas pressure on line 104 causes the shaft 100 to retract. Valve means 110 may comprise, for example, solenoid operated valves which are operated by electrical signals supplied by end effector control 114.

Extending from the end of shell 94 opposite flange 96 is a lever operating section 98. The lever operating section 98 comprises a hexagonal shaped outwardly radially extending flange which is received within the hexagonal portion of turret 48 core 48'. Each flat region of section 98 corresponds to and is nested aligned with a respective flat region 60–65 of turret 48. Each flat region of section 98 is bifurcated by a U-shaped groove, e.g., groove 118, aligned with device 32, FIG. 2. Groove 118 has a depth and extends parallel to axis 86 for a distance sufficient to receive the projecting depending portions of lever 74 and element 72 stem. Thus, a groove 118 is in each radially extending portion of section 98 corresponding to a flat region 60–65 of turret 48 and aligned with aperture 66' of that array 66. Grooves 118 form flange 98 into a plurality of radially extending ears, e.g., ears 120 and 122, FIG. 2. Ear 122 is formed by grooves 118 and 118', the latter corresponding to device 33, and ear 120 is formed by grooves 118 and 118" the latter corresponding to device 34.

Annular groove 124 is formed in the ears 120, 122, and so forth, of section 98 transverse to grooves 118 and is parallel to the plane of operating axes 20, 33', 34'and so forth. The groove 124 is discontinuous since each ear 120, 122, and so forth, is spaced by the axially extending grooves 118, 118', 118", and so forth. Groove 124 is also hexagonal in shape and has flat regions corresponding to the flat regions 60–65, FIG. 2. A portion of groove 124 is on each side of groove 118, 118', 118", and so forth. Groove 124 receives a lever drive pin, e.g., pin 84, of a corresponding lead processing device, e.g., device 32. Further, a pin 84 may be received in groove 124 on either side of groove 118. As shown, pin 84 is in portion 124' of groove 124 on the left of groove 118, FIG. 2. Pin 84 may also be in groove portion 124" on the other side of device 32. The groove portion that receives pin 84 depends on a particular device 32 construction and its desired direction of rotation. The device 32 movable element 72 direction of rotation is determined by which groove portion 124' or 124" receives the pin 84. For example, the movable element 72 is driven in a counterclockwise direction (in plan) when a pin 84 is located in groove portion 124'. When a pin 84 is located in groove portion 124", the movable element 72 is driven in a clockwise direction. Each device 32, 33, 34 secured to turret 48 has its lever pin in engagement with annular groove 124 either for clockwise or counterclockwise rotation in accordance with that device's construction. In the alternative, other kinds of recesses or apertures for engaging the lead processing device operating lever pins may be employed.

Housing 36 and turret 48, FIG. 1, may comprise a relatively lightweight material such as glass filled high strength plastic material comprising a blend of polystyrene and polyphenylene oxide with fillers and a flame retardant. This material is available under the trademark "Noryl," a registered trademark of the General Electric Company. Locking ring 56, FIG. 4, may be made of a slippery thermoplastic material such as Teflon. These structures are made as light as possible in order to minimize the load attached to the end of wrist 14'. Generally, robots support a maximum of about five pounds at the wrists. End effectors that weigh more than five pounds tend to be mispositioned due to compliance of the robot mechanisms.

In FIGS. 3 and 4, gear 126, which has an annular set of external gear teeth 134, is screwed to the end of shoulder 54 of turret 48 by screws 128. A metal plate 130 is over the face of gear 126 and is also fastened by screws 128. A screw 132 secures shaft 100 of cylinder 92 to gear 126 and plate 130. Air lines 102 and 104 of cylinder 92 pass through gear 126 and plate 130 for connection to valve means 110, FIG. 4. The drive and driven gears 150 and 126, respectively, and the member 90 may also comprise high strength lightweight plastic Noryl.

Gear 126 drive motor 136 is secured via flange 138 to bracket 140. Bracket 140 has a tongue 142 which mates with a slot 144 in housing 36. Bracket 140 is L-shaped and adjustably secured to the housing 36 at slot 144 for adjustment in directions 146, FIG. 3. Drive gear 150, FIG. 4, is secured to motor 136 shaft 148. Toothed drive belt 152 couples gear 150 to gear 126. Belt 152 rotates the turret 48 about axis 86 in accordance with a control signal applied to motor 136 by end effector control 114, FIG. 4. Motor 136 is geared down so that a relatively large rotational force on shaft 148 does not shift the shaft 148 angular position. This is to insure that the turret 148, once positioned by the motor 136, remains in that position in the presence of torques which may be induced as the lead processing devices are operated. Motor 136 can rotate turret 48 in two opposite angular directions 154, FIG. 1, about axis 86. This rotation positions any selected one of flat regions 60–65 so that its aperture 66' axis, i.e., the corresponding operating axis such as axes 20, 33', 34' and so forth, FIG. 2, can be positioned relative to the robotic wrist reference axis 20'.

In operation, robot 12, FIG. 1, in response to control 18 displaces its arm 14 so that its wrist 14' reference axis 20' is aligned to a component reference coordinate represented by axis 30, component 28. The wrist reference axis 20' can be aligned to any one of the axes 26', 29'', 27', and so forth, of any selected component on printed circuit board 22.

The arm 14 of the robot may be concurrently positioned while the turret 48 is angularly rotated relatively quickly about axis 86, FIG. 4. The turret is rotated until a selected one of the flat regions of the turret 48 carrying the lead processing device, e.g., device 32, corresponding to the type of component whose leads are to be processed is aligned to robot axis 20'. In this period the robot also rotates wrist 14' about axis 20' to orient the selected device 32 to the orientation of the component. In FIG. 4, cylinder 92 and actuating assembly 88 are rotated about axis 86 with the rotation of turret 48 relative to housing 36. Once the lead processing device operating axis, for example, axis 20 is aligned relative to the wrist axis 20', and the wrist 14' is rotated to an angle $\theta$ about axis 20', the robot arm is then moved along the z axis to engage the aligned lead processing device with the leads of the component on PCB 22, FIG. 1.

When the lead processing device engages the leads of the selected component in the z direction, the end effector control 114 is operated in response to a signal from the robot control 116 which indicates that the wrist is in position. Control 114 generates a signal on line 117 to cause valve means 110 to apply pressure on a selected one of lines 102 or 104. Ordinarily, pressure is supplied on the other of those lines 102 and 104 so that the cylinder 92 shaft 100 is retracted in its quiescent state, FIG. 3. When the shaft is retracted, the cylinder 92 is at its closest point relative to gear 126 in direction 108". In this retracted state the cylinder 92, attached to lever actuating member 90, is in the lever 74 quiescient state, FIG. 3.

Upon applying pressure to cylinder 92 to extend shaft 100 from the cylinder 92 body, the shaft remains stationary because it is attached to housing 36. Cylinder 92 moves away from gear 126 in direction 108', shown in phantom at 92', in response to the shaft extension. This movement causes member 90 secured to cylinder 92 to axially move in the same direction displacing the groove portion 124', and thus pin 84 of the lead processing device lever 74 in direction 108'. This action rotates lever 74 about the device operating axis 20 rotating the movable element 72 relative to the stationary element 68, FIG. 3. The leads 28' of the adjacent component 28, FIG. 1 are thus cut and then bent by the rotating movable element in a known way. In this embodiment all lead processing device levers are rotated simultaneously, even though only one device is engaged with component leads.

In FIG. 4, the end effector control 114 after displacing actuating assembly 88 in direction 108' causes the valve means to switch state and immediately retracts shaft 100. This retraction displaces actuating assembly 88 in direction 108'', returning the lever 74 to its original quiescent state, FIG. 3. Upon completion of the processing of the leads of that component, for example, component 28, arm 14 disengages the lead processing device from the leads of that component by lowering the wrist 14' along the z axis. The wrist 14' is then moved so that axis 20' is aligned with the next component whose lead or leads are to be processed.

If, by way of example, the next adjacent component to be processed, for example, component 26, has its leads in need of similar processing as the leads of component 28, the processing device 32 will remain aligned with the wrist axis 20'. However, device 32 may be rotated angle $\theta$ about axis 20' to orient it with the orientation of that component. If, device 27 which may be a three lead device as compared to the two leads of device 28 is to be processed, then the turret 48 is rotated about axis 86 in one of directions 154, FIG. 1, to align the corresponding lead processing device with axis 20'. If necessary, the wrist is again rotated an angle $\theta$ about the z axis to orient that device with the orientation of the leads of device 28. In this way, the leads, whether electrical component leads, mechanical tabs or other elements to be bent or trimmed or both, can be processed in any sequence. The lead processing devices are interchangeable with any of the aperture arrays 66 so that any device can be placed at any relative position on the turret 48.

In the alternative, other kinds of turrets may be used. For example, the turret may comprise a plane platform rotatable about a vertical axis 20'. The devices operating axes can all be vertical parallel to axis 20' and rotated in merry-go-round fashion.

The lead processing devices being interchangeable with the aperture array 66 of the turret 48, are changed by merely disassembling one lead processing device and replacing it with a differently configured device relatively quickly. Further, because many components have similar leads which can be operated on by the same lead processing device, one general purpose lead processing device can process a large number of leads of different components merely by relocating and reorienting the wrist 20' to the desired component coordinate and orientation.

The lines 102 and 104 connected to cylinder 92 are of sufficient length where coupled to the valve means 110 such that rotation of the turret does not bind the lines. In this respect, the turret may be programmed to rotate back and forth only within a 360° arc. However, in the interest of time efficiency, it may be desirable to rotate the turret continuously more than 360° in any one direction in order to place the next lead processing device in position quickly. Such continuous rotation may tend to twist the lines 102 and 104. In this respect, the lines 102 and 104 are connected to a common swivel connector (not shown) which, in turn, is coupled to the valve means 110.

It is to be understood that while a rotatable turret is illustrated herein for carrying a plurality of different lead processing devices secured to base 38, a linearly moving system may be coupled to the base 38 for aligning a given lead processing device to the robot wrist axis 20', FIG. 1. Each linear system may be similar to the system illustrated in FIGS. 1-3 of U.S. Pat. No. 4,520,549, mentioned previously. In that case, the symbols 18 representing the support for supporting the system, FIG. 2, of that patent, would be secured to a base corresponding to base 38, FIG. 4, for attachment to a wrist 14' or its equivalent on a numerically controlled machine. In that case, the various plates and elements of the system are reduced in size and comprise lightweight Noryl plastic material to minimize their weight.

What is claimed is:

1. An apparatus for operation by a robot to process a component lead, extending from a substrate at a reference location and orientation, with a lead processing device having a first element and a second element at least one of which movably cooperates with the other to process said lead, said apparatus comprising:

a support adapted to be attached to said robot;

an annular member secured to the support for rotation about an axis, said member including a plurality of means annularly spaced about the axis, each for releasably securing a lead processing device thereto at a given annular position relative to said axis; and means secured to the support and coupled to the member for selective displacement in opposite linear directions parallel to said axis for simultaneously operating a releasably secured lead processing device at any of said spaced means.

2. The apparatus of claim 1 wherein said apparatus further includes means coupled to the support and the member for rotatably placing a selected one of the means for releasably securing at a reference position relative to the support.

3. The apparatus of claim 1 wherein said means for simultaneously operating includes cylindrical member slidably secured to the annular member for axial displacement along said axis and actuating means coupled to said cylindrical member and said support for selectively reciprocating said cylindrical member along said axis, said cylindrical member including means adapted to operate said at least one movable element when displaced.

4. Apparatus for robotically processing a lead of a component extending from a substrate with a lead processing device having a pair of elements at least one of which movably cooperates with the other to process said lead, said apparatus comprising:

a housing adapted to be releasably attached to a robot;

annular support means rotatably secured to the housing for rotation about an axis and including a plurality of means for releasably securing thereto a like plurality of said lead processing devices annularly spaced about the axis, each said means for securing adapted to receive a separate lead processing device at a corresponding lead processing operating axis;

first and second drive means coupled to the housing and support means for respectively operating said lead processing devices and for rotating said support means in response to respective corresponding first and second control signals applied as inputs thereto; and control means for generating and applying said first and second control signals respectively to said first and second drive means to move the support means relative to the housing to align the operating axis corresponding to a selected one of said plurality of securing means at a reference position relative to said housing and for then operating the at least one movable element of the lead processing device at said reference position.

5. The apparatus of claim 4 wherein said at least one movable element rotates relative to the second element about a corresponding one of said operating axes, said first drive means includes a second annular member slidably secured to the first annular member adapted to operate said received lead processing device at least one movable element when displaced, and displacement means secured to the housing for selectively displacing the asecond annular member in back and forth directions normal to said operating axes.

6. The apparatus of claim 4 wherein said second drive means includes a motor secured to the housing and means coupling said motor to said support means for selectively moving the support means, said first drive means including actuating means secured to said support means and a lead processing movable element operating member coupled to and responsive to the operation of said actuating means, said operating member being movably secured to the support means for relative displacement thereto.

7. The apparatus of claim 4 further including at least one lead processing device, said at least one lead processing device including a stationary element secured to the support means and a moving element rotatably secured to the stationary element for rotation about its corresponding support means operating axis, said first drive means including means coupled to the support means for rotating said moving member.

8. The apparatus of claim 4 wherein said housing has a first annular opening, said support means comprising a first annular member rotatably secured to the housing in said annular opening, said second drive means comprising motor means for rotating said first annular member in a given angular direction relative to the housing in response to the second of said control signals applied thereto, said first drive means comprising a second annular member, said support means having a second annular opening for slidably receiving said second annular member in a direction normal to said operating axes, said second annular member being adapted to be coupled to and operate said at least one movable element when displaced, and actuating means responsive to said first control signal for displacing said second annular member.

9. An end effector for a robot wrist, said end effector for processing a lead of a component, extending from a substrate, with a lead processing device having a pair of elements which cooperate to process a lead, said robot including means for aligning the wrist to a reference position corresponding to the position of said extended lead, said end effector comprising:

a housing adapted to be secured to said wrist;

a lead processing device support rotatably secured to the housing about a support axis, said support including a plurality of apertures annularly spaced about said axis for receiving a corresponding lead processing device, each aperture defining a lead processing axis;

support drive means coupled to the housing for selectively rotating the support about its axis to align a selected one of said lead processing axes relative to a reference orientation corresponding to said reference position; and lead processing device actuating means movably secured to said support including means for displacing said actuating means relative to the support and adapted to operate the movable element of the received lead processing means corresponding to the aligned one lead processing axis.

10. The end effector of claim 9 wherein said support includes a first annular section containing said apertures, a second annular bearing section secured to the first section and rotatably mating with said housing, and a third annular drive section secured to one of the first and second sections and including a drive member, said support drive means including a motor secured to the housing coupled to operate said drive member and control means for selectively operating said motor.

11. The end effector of claim 9 wherein said actuating means includes an annular member having a plurality of recesses at a peripheral surface thereof, said annular member being secured to said support for axial displacement along the support axis, said recesses being aligned relative to said spaced apertures and adapted to be coupled to a movable one element of the received lead processing device at said reference position for operating that element when axially displaced relative to the other element; a drive device coupled to the housing to axially displace the annular member and said recesses relative to the support; and control means for selectively operating said drive device.

12. The end effector of claim 11 wherein said drive device includes a fluid operated cylinder having a piston contained within a cylinder housing, one of said piston and cylinder housing being secured to said support and the other being secured to said annular member.

13. An end effector for a robot, said robot including a wrist and means for locating said wrist relative to a reference axis, said end effector comprising:
a ring member;
means for attaching said ring member to said wrist;
a first cylindrical member including a bearing rotatably secured to the ring member, a plurality of annularly spaced means for releasably securing a like plurality of lead processing devices thereto, a separate lead processing device corresponding to each said spaced means and defining a lead processing axis thereat and a drive gear, said cylindrical member having an internal bearing defining an axis normal to said lead processing axes;
a motor secured to the ring member including means for rotatably driving said gear;
a second cylindrical member slidably secured to said internal bearing for displacement along said internal bearing axis, said second member including means for operating said secured lead processing device when displaced;
an actuating device coupled to said first and second cylindrical members for axially displacing said second cylindrical member relative to the first cylindrical member to thereby operate said secured lead processing devices; and
control means coupled to said motor and to said actuating device for operating said motor to selectively align one of said lead processing axes relative to said reference axis and when so aligned for operating said aligned actuating device.

14. The end effector of claim 13 wherein said lead processing devices each including a stationary member, said spaced means each being adapted to secure said stationary member to said first cylindrical member, said lead processing devices further including a rotatable member which cooperates with the stationary member for processing a corresponding lead aligned at said reference axis, said rotatable member including a drive lever, said second cylindrical member including a drive lever receiving recess adjacent to each said spaced means, each said recess being located spaced from the corresponding lead processing axis.

15. The end effector of claim 13 wherein said actuating device includes a pneumatic cylinder having a piston receiving body and a piston operated shaft, said shaft being secured to one of said first and second members, said body being secured to the other of said first and second members.

* * * * *

UNITED STATES PATENT AND TRADEMARK OFFICE
CERTIFICATE OF CORRECTION

PATENT NO. : 4,691,419

DATED : September 08, 1987

INVENTOR(S) : Brian Gerard Keeler et al.

It is certified that error appears in the above-identified patent and that said Letters Patent is hereby corrected as shown below:

Claim 5, column 12, line 20, "asecond" should read --second--.

Signed and Sealed this

Nineteenth Day of April, 1988

Attest:

DONALD J. QUIGG

*Attesting Officer*   *Commissioner of Patents and Trademarks*